United States Patent
Fukutomi et al.

Patent Number: 5,567,288
Date of Patent: Oct. 22, 1996

[54] CRYSTAL-ORIENTED THIN FILM MANUFACTURING APPARATUS

[75] Inventors: Masao Fukutomi; Shigeki Aoki; Kazunori Komori; Toshihisa Asano; Yoshiaki Tanaka; Hiroshi Maeda, all of Ibaraki, Japan

[73] Assignees: Mituba Electric Mfg. Co., Ltd., Gunma; National Research Institute for Metals, Tokyo, both of Japan

[21] Appl. No.: 313,339

[22] Filed: Sep. 27, 1994

[30] Foreign Application Priority Data

Sep. 27, 1993  [JP]  Japan ..................... 5-239512

[51] Int. Cl.$^6$ ............... C23C 14/34; C23C 14/50
[52] U.S. Cl. ............. 204/298.06; 204/298.11; 204/298.15
[58] Field of Search ............ 204/298.01, 298.06, 204/298.11, 298.14, 298.15, 298.05, 192.3, 192.24; 505/474, 475, 476, 731

[56] References Cited

U.S. PATENT DOCUMENTS

| | | | |
|---|---|---|---|
| 3,530,057 | 9/1970 | Muly, Jr. ........................... | 204/298.06 |
| 3,897,325 | 7/1975 | Aoshima et al. ................. | 204/298.06 |
| 4,297,189 | 10/1981 | Smith, Jr. et al. ................ | 204/298.06 |
| 4,407,894 | 10/1983 | Kadokura et al. .................. | 204/192.3 |
| 5,114,556 | 5/1992 | Lamont, Jr. ....................... | 204/298.06 |

*Primary Examiner*—R. Bruce Breneman
*Assistant Examiner*—Rodney G. McDonald
*Attorney, Agent, or Firm*—Wenderoth, Lind & Ponack

[57] ABSTRACT

A substrate electrode having a plurality of substrate holders capable of causing a substrate to tilt by an arbitrary angle $\theta$ relative to the horizontal plane is provided. A plurality of auxiliary electrodes are arranged substantially vertically below the substrate electrode and between the substrate electrode and a target. The substrate electrode and the auxiliary electrodes are electrically insulated from the target. Bias voltage applied to the substrate electrode and the auxiliary electrodes causes the plasma boundary between the cathode dark space and the negative glow to form a cathodic plasma space having a parabolic section, thus forming a crystal-oriented thin film on the substrate surface.

3 Claims, 6 Drawing Sheets

F I G. 1
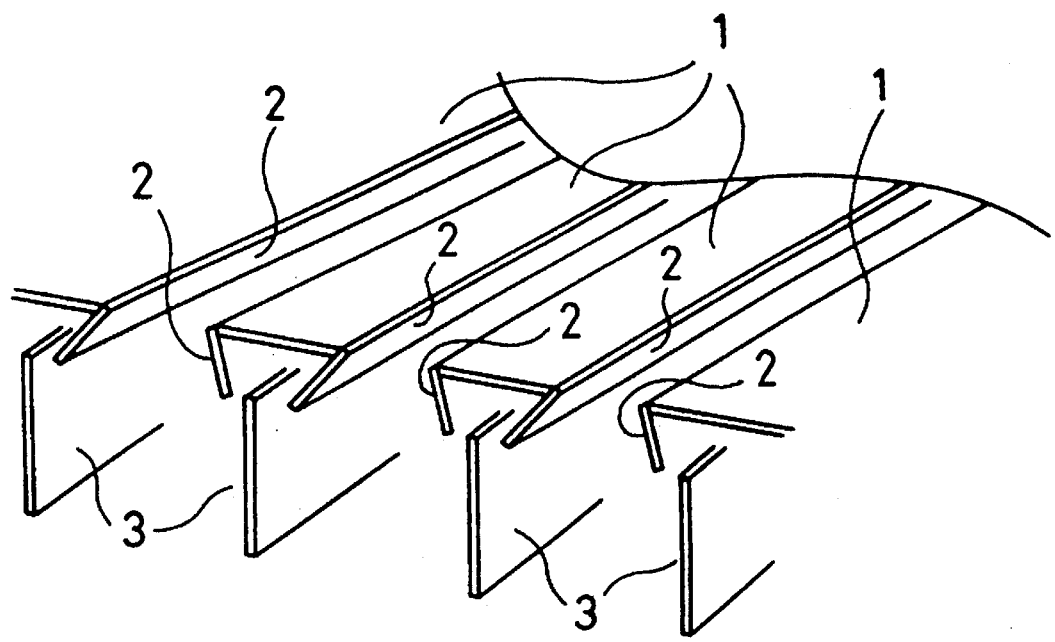
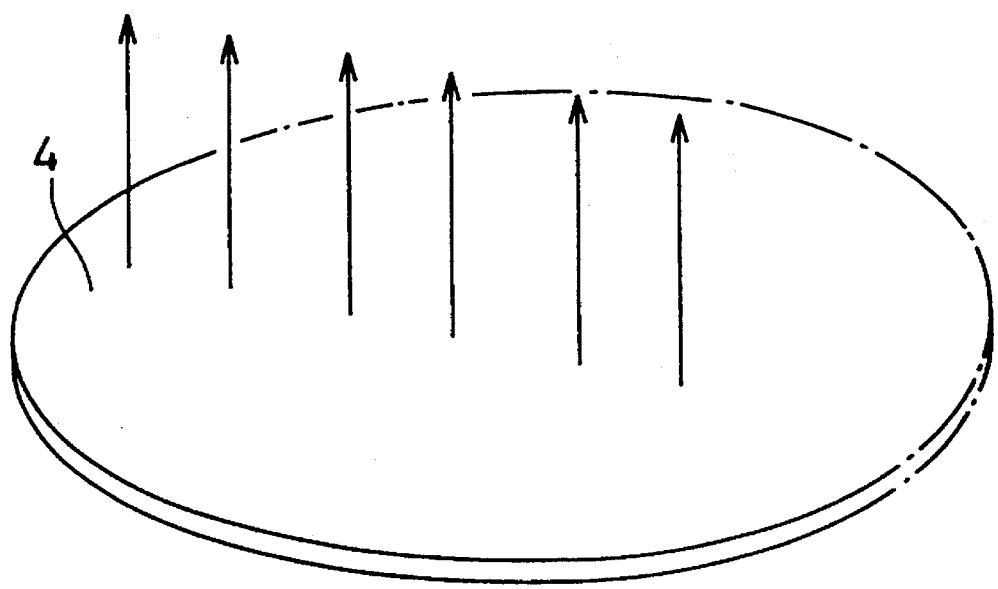

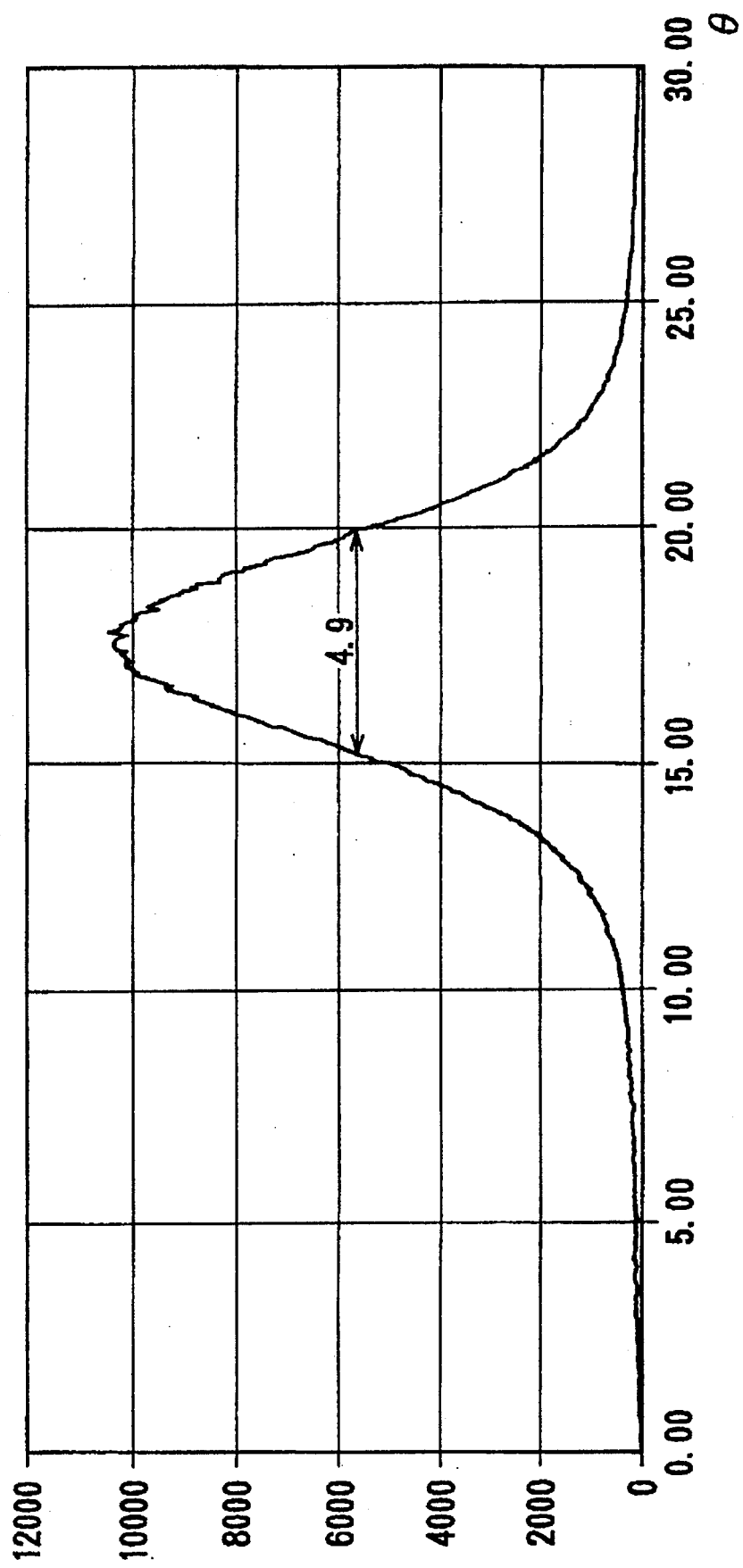
F I G. 4

F I G. 5
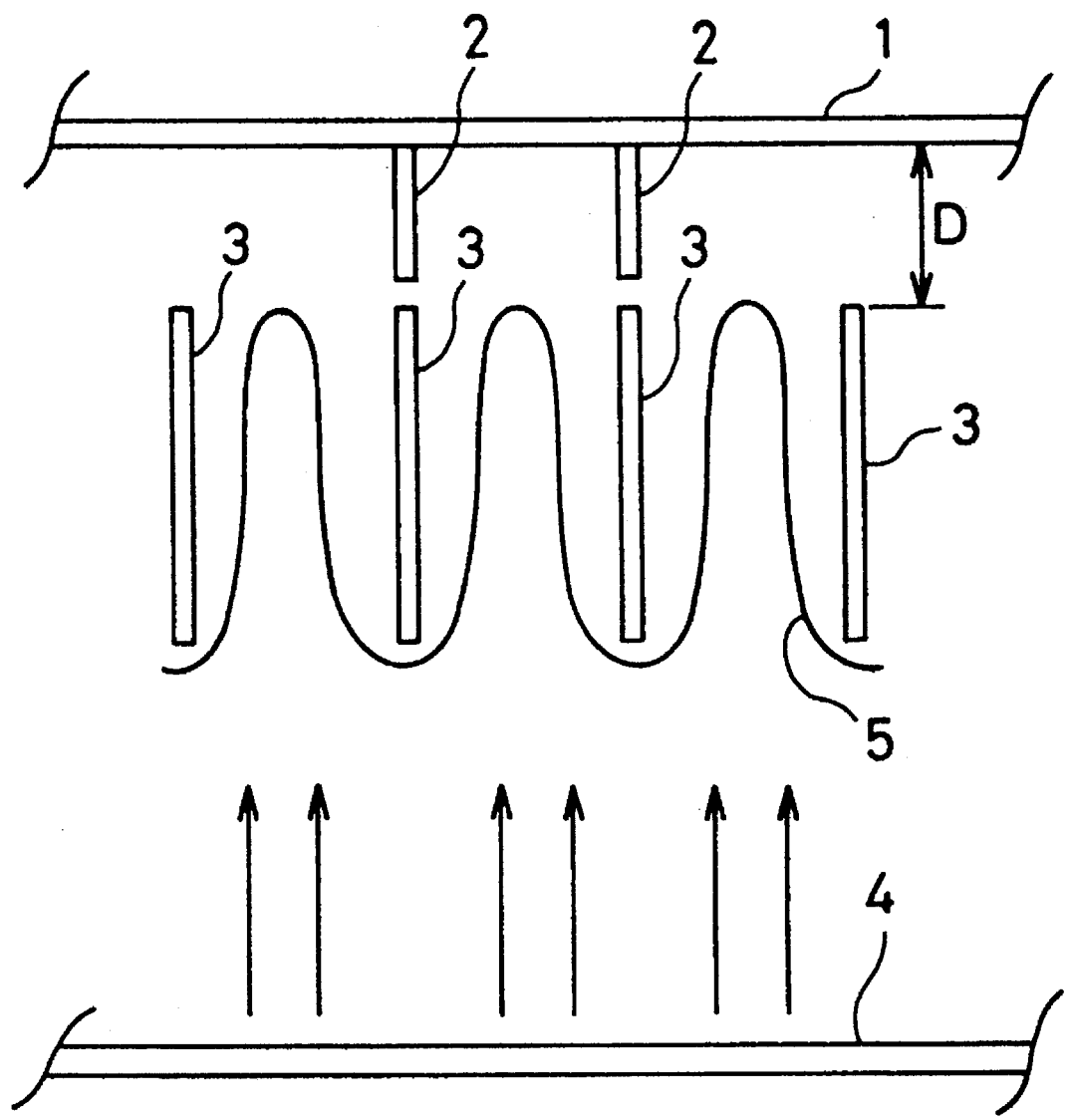

CRYSTAL-ORIENTED THIN FILM MANUFACTURING APPARATUS

FIELD OF THE INVENTION

The present invention relates to a crystal-oriented thin film manufacturing method which permits control of crystal orientation of a thin film during forming. More particularly, the present invention relates to a novel crystal-oriented thin film manufacturing method which permits very efficient manufacture of a thin film having a preferred orientation suitable for such uses as various functional thin films and buffer thin films for crystal growth, by using a sputtering apparatus, and causing a charged particle group to obliquely enter the growing film surface while controlling the particle group.

DESCRIPTION OF THE PRIOR ART

Along with the recent progress of extra-precision and extra-fine technologies, functional thin film technologies have achieved very remarkable progress. This progress is supported by control technology of thin film crystal structure as typically represented by epitaxy, i.e., by control technology of crystal orientation.

There are however problems not as yet solved by these technical innovations, and one of these problems is that it is difficult to cause crystal growth while controlling crystal orientation on a polycrystalline substance or an amorphous substance.

When causing a thin film to grow on a substrate comprising a polycrystalline substance such as a metal or a ceramics or an amorphous substance such as glass, the possibility of causing such growth while controlling crystal orientation, if any, would make it possible to provide a thin film having more sophisticated physical and chemical properties or functions in a variety of areas such as superconductivity, magnetic thin film and optical thin film.

When manufacturing an orientation film on a substrate comprising a polycrystalline substance or an amorphous substance, orientation in only a uniaxial orientation, as in a c-axis orientation crystal accounts most of the orientation. In order to obtain a thin film of triaxial orientation in the form of a single crystal, on the other hand, it has conventionally been the only practice to form the film by using a single-crystal substrate by the epitaxial technique, or by the graphoepitaxy technique of causing growth of a single-crystal film by applying a fine step processing to the substrate surface by means of the patterning technique.

Under these circumstances as described above, L. S. Yu et al. of IBM released their first report suggesting the possibility of controlling not only the c-axis but also orientation within the a-b plane by forming an Nb thin film on a glass substrate by the application of the ion-assist film forming process using the dual ion beam sputtering technique in 1985 (L. S. Yu, et al.: Appl. Phys. Lett. 47 (1985) p. 93, 2).

Then in 1991, Y. Iijima et al. of Fujikura have reported their success in triaxial orientation of a YSZ (yttria-stabilized zirconia) thin film on a polycrystalline metal substrate by a similar dual ion beam technique (Y. Iijima, et al.: Appl. Phys. Lett. 60 (1992), p. 769).

In 1992, furthermore, Reade et al. obtained similar results by using an ion beam assist gun for laser deposition (Appl. Phys. Lett. 61 (1992), p. 2231).

In the film-forming methods presented in these reports, however, use of an expensive film-forming apparatus such as a dual ion beam apparatus is indispensable, and it has not as yet been possible to highly control the crystal orientation simply by an inexpensive general-purpose apparatus.

The present inventors therefore developed an apparatus by incorporating a special electrode structure into a sputtering apparatus for manufacturing a plane oriented film while irradiating a charged particle group onto the film surface in the form of a beam (Japanese Patent Application No. 4-322, 318).

The above-mentioned new apparatus, although having some excellent features not available so far in the formation of a plane oriented film, has had some points to be improved regarding quality of the oriented film, productivity and operability as an equipment.

An object of the present invention is to provide a crystal-oriented thin film manufacturing apparatus which permits efficient manufacture of a thin film having an excellent plane orientation equal to, or even superior to, that of ion beam, on one side or both sides of a substrate.

This and other objects, features and advantages of the invention will become more apparent upon a reading of the following detailed specification and drawings.

BRIEF DESCRIPTION OF THE DRAWINGS

FIG. 1 is a perspective view illustrating the apparatus in Example 1;

FIG. 4 is a diffraction diagram illustrating the peak half-amplitude level of the YSZ film (200) formed in Example 1;

FIG. 5 is a front sectional view of the apparatus in Example 2; and

DETAILED DESCRIPTION OF THE INVENTION

Figure 2:
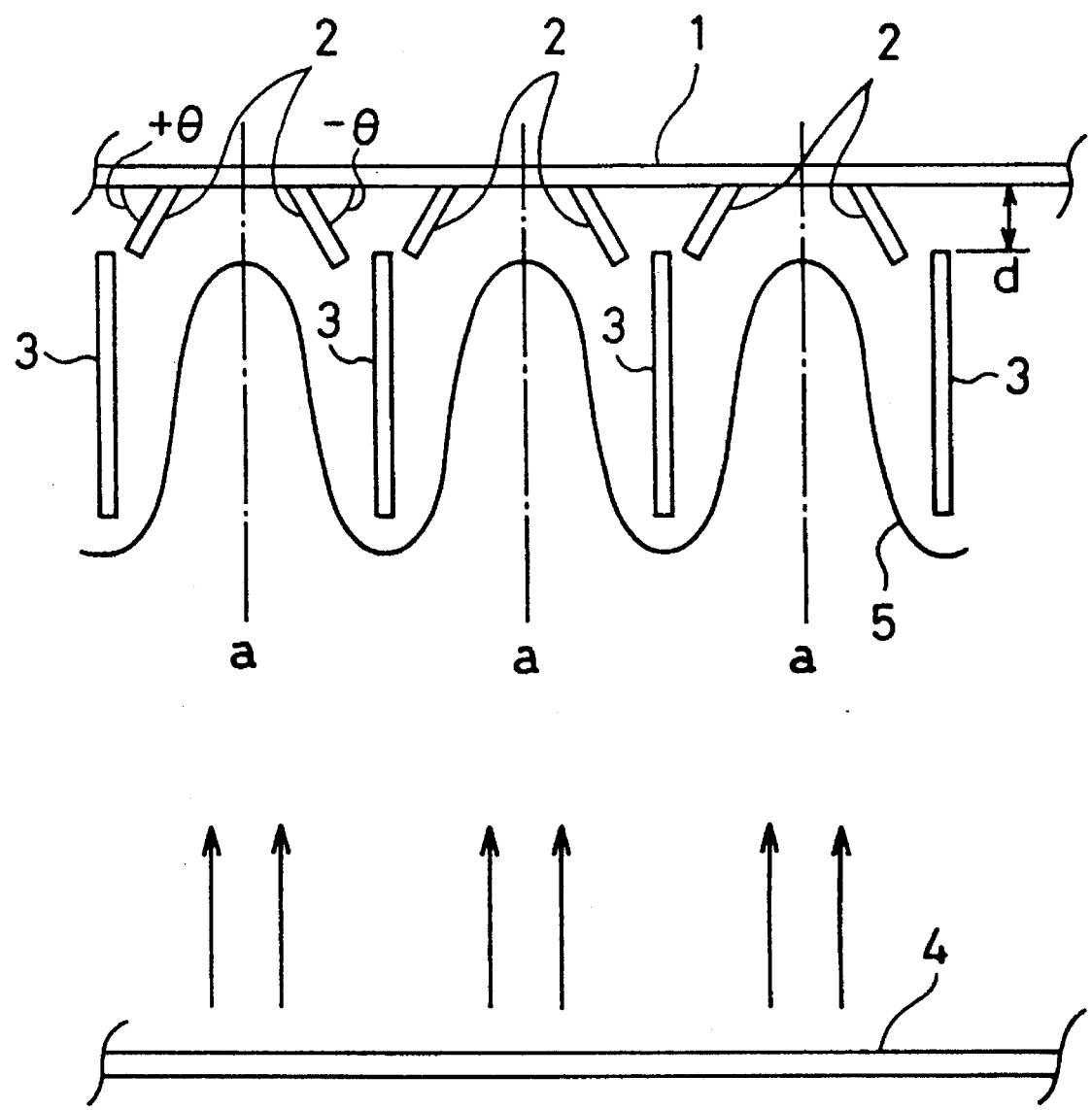
FIG. 2 is a front sectional view of the apparatus shown in FIG. 1.

The present invention provides a crystal-oriented thin film manufacturing apparatus which comprises a substrate electrode having a plurality of substrate holders capable of causing a substrate to tilt by an arbitrary angle $\theta$ relative to the horizontal plane, and a plurality (n) auxiliary electrodes arranged substantially vertically below the substrate electrode and between the substrate electrode and a target, said substrate electrode and said auxiliary electrodes being electrically insulated from said target; wherein a negative pole plasma space is formed by a bias voltage applied to said substrate electrode and said auxiliary electrodes, and oriented crystalline thin film is formed on the surface of said substrate.

In addition, the present invention provides the following embodiments of the above-mentioned apparatus:

<A> Providing, for each discharge space formed by a pair of adjacent auxiliary electrodes and a substrate electrode, 2(n–1) substrate holders on the substrate electrode, pairs of the substrate holders provided on the substrate electrode at a position apart from the center line of the auxiliary electrode pair by a distance ¼ the distance between the electrodes in that pair, attaching the substrate to the substrate holders at an arbitrary inclination angle θ relative to the horizontal plane with the lower end of the substrate disposed over the upper end of the closest auxiliary electrode, and forming an oriented film on one side of the substrate simultaneously.

<B> Arranging (n–2) substrate holders on the substrate electrode opposite to (n–2) auxiliary electrodes by removing the two auxiliary electrodes at the both ends, attaching a substrate vertically to each substrate holder, and simultaneously forming oriented films on the both sides of the substrate.

<C> Forming an electrode pair with four adjacent auxiliary electrodes, arranging two each of the four auxiliary electrodes in pair symmetrically at an inclination angle of from 10° to 30° relative to the vertical plane, arranging n/4 substrate holders on a substrate electrode at a position closest to the two auxiliary electrodes on the center line of each electrode pair and inside among the four, attaching a substrate vertically to each substrate holder, and forming oriented films simultaneously on both sides of the substrate.

The electrode structure incorporated into the sputtering apparatus, which forms the key of the present invention, comprises a substrate electrode having a plurality of substrate holders capable of causing a substrate to tilt by an arbitrary angle θ relative to the horizontal plane, and a plurality (n) auxiliary electrodes arranged substantially vertically below the substrate electrode and capable of forming a negative pole plasma space between each auxiliary electrode and a target below.

While any conductive material may be used to compose these electrodes, the electrodes should preferably be made of the element of the film when it is absolutely required to avoid mixture of impurities into the film.

The relative positions of the substrate electrode and the auxiliary electrodes should more specifically be such that, in the embodiment <A> described above, for example, as shown in FIGS. 1 and 2 among other attached drawings, a substrate holder 2 to which a substrate is to be attached should be capable of changing the substrate surface from horizontal to an angle θ. The n auxiliary electrodes 3 arranged substantially vertically are provided among the substrate holder 2 and the target 4, and are usually located at a position permitting surrounding of the substrate on the substrate side.

The substrate holder 2 is attached at a position apart from the center line a of the discharge space formed by the electrode pair of two auxiliary electrodes 3 and the substrate electrode 1 on the electrode pair side by a distance equal to ¼ of the distance between the electrodes in pair. Directions of entrance of $Ar^+$ ion flows from the plasma space are unified into a single direction, and as a result, orientation of the film can further be intensified. An oriented film is simultaneously formed on a side of each of the 2(n–1) substrates.

In this case, the distance d between the horizontal position of the substrate electrode 1 and the upper end of the auxiliary electrode 3 should be up to the average free stroke of particles in the sputtering atmosphere. This is to accelerate $Ar^+$ ions derived from the cathode plasma space to go straight in the cathode dark space, and to cause them to enter the film growing plane at an angle θ.

A distance d should be appropriately selected in accordance with the film to be formed, sputtering conditions and bias voltage conditions, usually within a range of from 5 to 15 mm.

The film grows through balance between accumulation of the film material from the target and sputter etching of the film material by ions. The sputter etching ratio is dependent on the angle of incidence of ions for some substances. The above-mentioned angle θ should preferably be an angle substantially corresponding to the angle of incidence of ions for efficient sputter etching: an optimum angle θ can be expressed as θ=+75° or θ=–75° from the horizontal plane with the clockwise turn as – and the counterclockwise turn as +.

Voltage Vs applied to the substrate electrode 1 and voltage Vh applied to the auxiliary electrode 3 should be variable relative to earth potential, and an ammeter capable of measuring respective ion current is attached. Bias voltage may be about –300 to –100 V for both Vs and Vh.

According to the present invention, it is possible to achieve a special orientation, not based on the preference orientation (Bravais' empirical law) of film growth. There is available a monocrystalline-like film oriented not only in c-axis but also in a and b-axes. It is possible to form films on single sides or both sides of a plurality of long substrates at the same time.

When applying an oxide superconductive thin film to a magnetic shield of an electronic device, a film may be formed on a polycrystalline substrate such as a metal. For such an oxide superconductor, there is a demand for a film forming technology of a film having a high critical current density. In general, however, while orientation can easily be achieved for a single axis of c-axis only, it is not easy to achieve orientation in both a and b-axes within the substrate surface. Consequently, crystal grains grow out of order to form grain boundaries, so that the current-carrying capacity of the films is limited to a very low level.

All these problems can be solved, in the present invention, by previously preparing a triaxially oriented film as a buffer film on a metallic device, and causing a superconductive film to grow epitaxially, thus forming a superconductive film in which grains are oriented within a plane.

In the present invention, the apparatus can be incorporated in a usual sputtering apparatus, eliminating the necessity of an expensive ion gun or a high-vacuum evacuating system. The present invention is excellent also in that a film having a high plane orientation not inferior to one available by the ion beam method can be formed at a high efficiency by a simple method. Future application to various functional thin films such as perowskite is expected.

Now, the present invention is described below further in detail by means of some examples.

EMBODIMENT

EXAMPLE 1

In the example shown in FIGS. 1 and 2, the substrate electrode 1 is horizontally arranged. Six substrate holders 2 are provided for this substrate electrode 1. The substrate holders 2 are rotatable by a rotary stage. Four auxiliary electrodes 3 are provided substantially vertically. The auxiliary electrodes 3 are arranged below the substrate holders 2 and between the substrate holders 2 and the sputter target 4. The substrate electrode 1 and the auxiliary electrodes 3 as described above are incorporated in the sputtering apparatus. More specifically, these substrate electrode 1 and auxiliary electrodes 3 are made of zirconium partially with copper. An auxiliary electrode 3 is a rectangular plate having a size of 20×100 mm, and two adjacent auxiliary electrodes are arranged at intervals of 20 mm, apart from the substrate electrode 1 by a distance of 5 mm. The substrate holders 2 are arranged at a distance of 5 mm on the electrode pair side from the center line a of the discharge space formed by an electrode pair of two auxiliary electrodes 3 and the substrate electrode 1. A substrate is attached to these substrate holders 2. The substrate is held by the substrate holders 2 at an angle of ±75° from horizontal plane. The substrate is made of Hastelloy C and the target 4 is made of YSZ (yttria-stabilized zirconia). With a distance of 80 mm between the substrate and the target 4, a bias voltage of −200 V was applied to the substrate electrode 1 and the auxiliary electrode 3. Under conditions including an RF power density to the target 4 of 3 W/cm$^2$, and a sputter gas (Ar-2% O$_2$) pressure of 4×10$^{-3}$ Torr, YSZ thin films were formed simultaneously on six substrates at about 5 Å/s. The plasma boundary in this film formation between the cathode dark space and the cathode glow is shown in FIG. 3.

Figure 3:
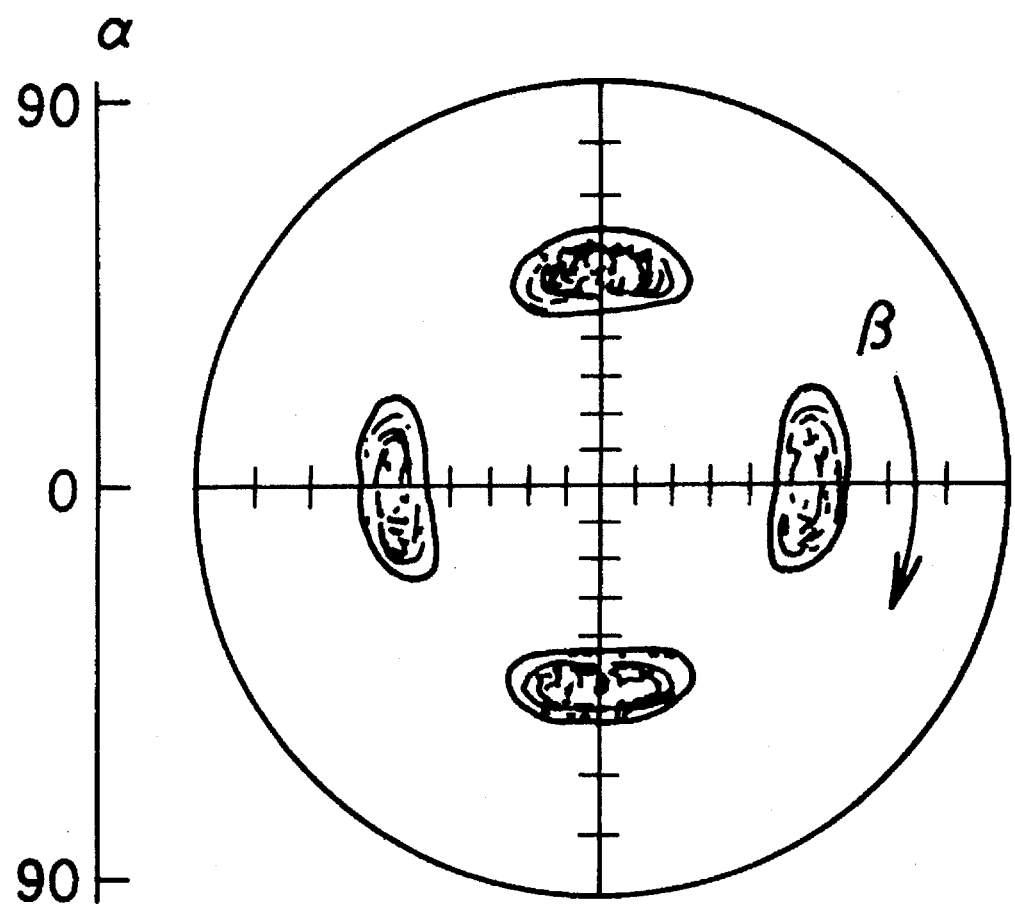
FIG. 3 is a pole figure of the YSZ film formed in Example 1.

According to an X-ray pole figure measurement of the YSZ film thus obtained, all the samples had an intensive ab plane orientation as shown in the YSZ thin film (111) pole figure in FIG. 3, and also had a c-axis orientation as well, with the c-axis (200) directed perpendicular to the substrate, as shown in FIG. 4 illustrating the half-amplitude level of peak (4.9°) of the YSZ thin film (200).

EXAMPLE 2

The example shown in FIG. 5 corresponds to the embodiment <B> described previously. The substrate holders 2 are arranged directly above a pair of two auxiliary electrodes 3 (all the auxiliary electrodes except for the two at the both ends). The auxiliary electrodes 3 are arranged at positions at a distance D from the substrate electrode 1. This distance D is set to satisfy the relationship D>d relative to the distance d in the Example 1. The substrate is attached vertically, spaced apart by 2 mm from the auxiliary electrodes 3. Films were formed on both sides of the substrate under the same film forming conditions as in the Example 1. The plasma boundary 5 formed a boundary between the cathode dark space and the cathode glow, the sectional face thereof forming a parabolic plasma.

The YSZ thin films formed on both sides of the substrate had triaxial orientation as in the Example 1.

EXAMPLE 3

Figure 6:
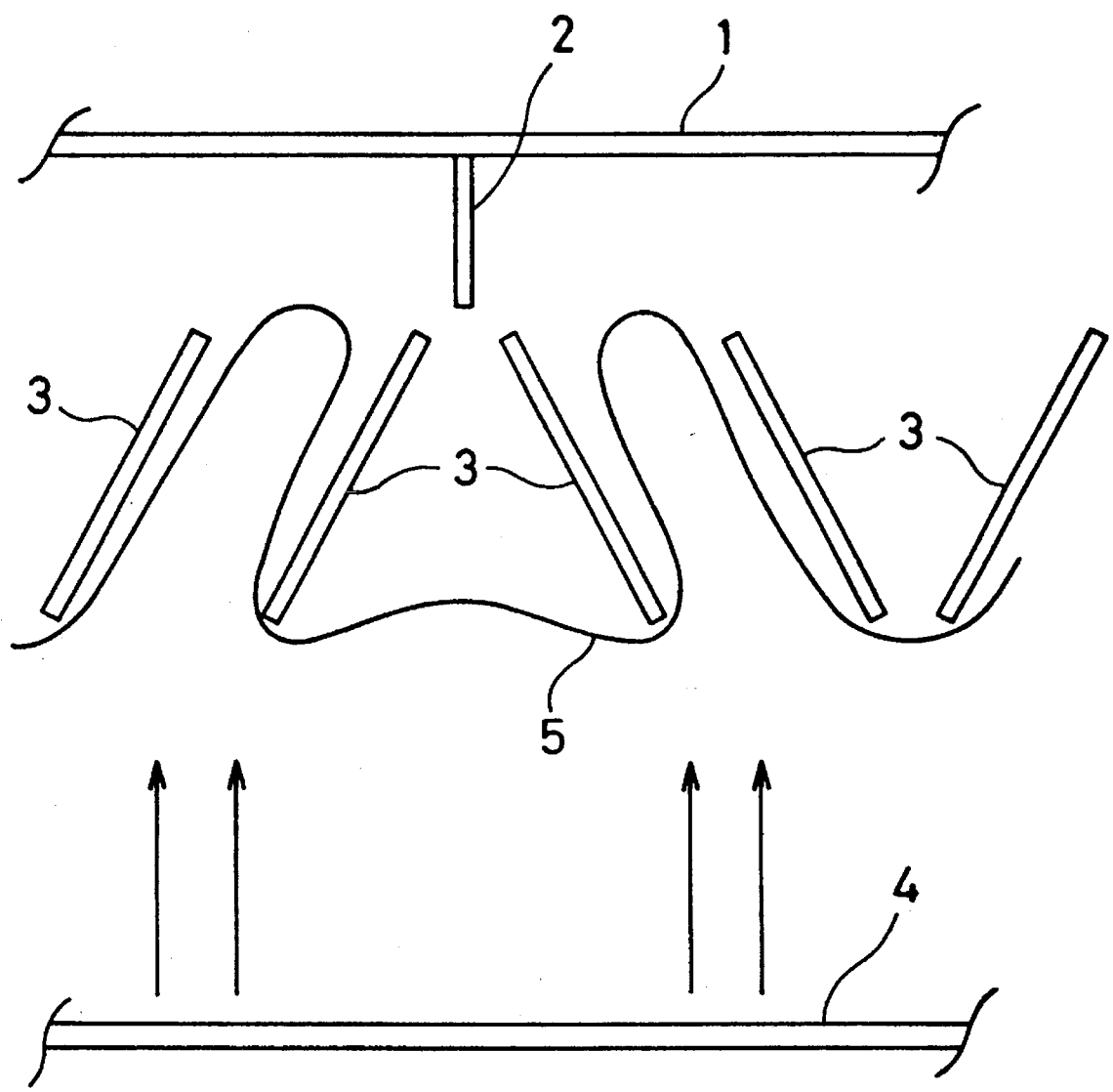
FIG. 6 is a front sectional view of the apparatus in Example 3.

The example shown in FIG. 6 corresponds to the above-mentioned embodiment <C>. An electrode pair was formed with four adjacent auxiliary electrodes 3, and two each were arranged symmetrically at an angle of 10° to 30° to the vertical plane. A substrate holder 2 was arranged on the center line of the electrode pair and closest to the two inner auxiliary electrodes 3. One substrate was attached vertically to each substrate holder 2. Under the same film forming conditions as in the Example 1, oriented films were simultaneously formed on both sides of the substrate. The plasma boundary 5 shown in FIG. 6 formed a boundary between the cathode dark space and the cathode glow, the sectional face thereof forming a parabolic plasma.

The YSZ thin films formed on both sides of the substrate had triaxial orientation as in the Example 1.

A YBa$_2$Cu$_3$O$_7$ superconductive film was formed on a Hastelloy substrate having the above-mentioned YSZ as the buffer film: a high critical current value of about 10$^5$ A/cm$^2$ was shown at a liquid nitrogen temperature of 77 K.

It is needless to mention that the present invention is not limited to these examples, but various other embodiments are possible in detailed configurations.

What is claimed is:

1. A crystal-oriented film manufacturing apparatus, comprising a substrate electrode positioned in a horizontal plane, electrically insulated from a target disposed below said substrate electrode and having a plurality of substrate holders capable of causing a substrate to tilt by an arbitrary angle θ relative to the horizontal plane;

a plurality (n) of auxiliary electrodes arranged over said target and substantially vertically below the substrate electrode, and electrically insulated from the target;

a discharge space formed by adjacent auxiliary electrodes and the substrate electrode; and 2(n−1) substrate holders provided on the substrate electrode, pairs of the substrate holders provided for each discharge space at a position apart from a center line of an adjacent auxiliary electrode pair by a distance ¼ as short as the distance between the electrodes in said pair;

wherein said apparatus is suitable for use in a process in which a substrate is attached to the substrate holders at an arbitrary inclination angle θ relative to the horizontal plane with the lower end of the substrate disposed over the upper end of the closest auxiliary electrode; a negative voltage is applied both to the substrate electrode and to the auxiliary electrodes to cause a plasma boundary to form on a visionary outline drawn along surfaces of the substrate electrode and the auxiliary electrodes in the discharge space; and an oriented crystalline film is formed on the surface of said substrate.

2. A crystal-oriented film manufacturing apparatus, comprising a substrate electrode positioned in a horizontal plane, electrically insulated from a target disposed below said substrate electrode and having a plurality of substrate holders;

a plurality (n) of auxiliary electrodes arranged over said target and substantially vertically below the substrate electrode, the arrangement of auxiliary electrodes having two ends with two auxiliary electrodes located at the ends and electrically insulated from the target;

a discharge space formed by adjacent auxiliary electrodes and the substrate electrode; and (n−2) substrate holders vertically arranged on the substrate electrode opposite to (n−2) auxiliary electrodes other than the auxiliary electrodes located at both ends of the arrangement;

wherein said apparatus is suitable for use in a process in which a substrate is vertically attached to each substrate holder; a negative voltage is applied both to the substrate electrode and to the auxiliary electrodes to cause a plasma boundary to form on a visionary outline drawn along surfaces of the substrate electrode and the auxiliary electrodes in the discharge space; and an oriented crystalline film is formed on both a front and a rear surface of said substrate.

3. A crystal-oriented film manufacturing apparatus, comprising a substrate electrode positioned in a horizontal plane, electrically insulated from a target disposed below said substrate electrode and having a plurality of substrate holders;

a plurality (n) of auxiliary electrodes arranged over said target and substantially vertically below the substrate electrode, and electrically insulated from the target;

a discharge space formed by adjacent auxiliary electrodes and the substrate electrode;

an electrode pair formed with the adjacent auxiliary electrodes, each two of adjacent auxiliary electrodes in said electrode pair being arranged symmetrically at an inclination angle of from 10° to 30° relative to a vertical plane; and (n/4) substrate holders vertically arranged on the substrate electrode at a position on a center line extending between the two inside auxiliary electrodes in the electrode pair;

wherein said apparatus is suitable for use in a process in which a substrate is vertically attached to each substrate holder; a negative voltage is applied both to the substrate electrode and to the auxiliary electrodes to cause a plasma boundary to form on a visionary outline drawn along surfaces of the substrate electrode and the auxiliary electrodes in the discharge space; and an oriented crystalline film is formed on the surface of said substrate.

* * * * *